(12) United States Patent
Matsui et al.

(10) Patent No.: US 12,469,716 B2
(45) Date of Patent: Nov. 11, 2025

(54) PLASMA ETCHING METHOD AND METHOD FOR MANUFACTURING SEMICONDUCTOR ELEMENT

(71) Applicant: SHOWA DENKO K.K., Tokyo (JP)

(72) Inventors: Kazuma Matsui, Tokyo (JP); Yuki Oka, Tokyo (JP)

(73) Assignee: Resonac Corporation, Tokyo (JP)

( * ) Notice: Subject to any disclaimer, the term of this patent is extended or adjusted under 35 U.S.C. 154(b) by 445 days.

(21) Appl. No.: 18/012,445

(22) PCT Filed: Jun. 24, 2021

(86) PCT No.: PCT/JP2021/023959
§ 371 (c)(1),
(2) Date: Dec. 22, 2022

(87) PCT Pub. No.: WO2022/044518
PCT Pub. Date: Mar. 3, 2022

(65) Prior Publication Data
US 2024/0038546 A1 Feb. 1, 2024

(30) Foreign Application Priority Data
Aug. 31, 2020 (JP) ................. 2020-145948

(51) Int. Cl.
*H01L 21/3213* (2006.01)
*C09K 13/00* (2006.01)
(Continued)

(52) U.S. Cl.
CPC ........ *H01L 21/32136* (2013.01); *C09K 13/00* (2013.01); *C23F 1/12* (2013.01);
(Continued)

(58) Field of Classification Search
None
See application file for complete search history.

(56) References Cited

U.S. PATENT DOCUMENTS 5,843,277 A 12/1998 Goto et al.
6,368,978 B1 4/2002 Kumar et al.
(Continued)

FOREIGN PATENT DOCUMENTS

JP 06-151375 A 5/1994
JP 10-303176 A 11/1998
(Continued)

OTHER PUBLICATIONS

D.J. Kim et al., "Role of N2 during chemical dry etching of silicon oxide layers using NF3/N2/Ar remote plasma", Microelectronic Engineering, vol. 84, pp. 560-566. (Year: 2007).*
(Continued)

*Primary Examiner* — Jiong-Ping Lu
(74) *Attorney, Agent, or Firm* — Sughrue Mion, PLLC

(57) ABSTRACT

A plasma etching method capable of selectively etching an etching object containing oxide of at least one of tin and indium compared to a non-etching object. The plasma etching method includes: an etching step of bringing an etching gas containing an unsaturated compound having a fluorine atom and a bromine atom in the molecule thereof into contact with a member to be etched including an etching object to be etched by the etching gas and a non-etching object not to be etched by the etching gas in the presence of plasma, performing etching while applying a bias power exceeding 0 W to a lower electrode supporting the member to be etched, and selectively etching the etching object compared to the non-etching object. The etching object contains oxide of at least one of tin and indium and the non-etching object contains at least one of a silicon-containing compound and a photoresist.

20 Claims, 1 Drawing Sheet

(51) Int. Cl.
*C23F 1/12* (2006.01)
*G03F 7/36* (2006.01)
*H01J 37/32* (2006.01)
*H01L 21/3065* (2006.01)
*H01L 21/467* (2006.01)
*H10F 71/00* (2025.01)

(52) U.S. Cl.
CPC .......... *G03F 7/36* (2013.01); *H01J 37/32422* (2013.01); *H01L 21/3065* (2013.01); *H01L 21/467* (2013.01); *H10F 71/1385* (2025.01); *H01J 2237/3346* (2013.01)

(56) References Cited

U.S. PATENT DOCUMENTS

| | | | |
|---|---|---|---|
| 9,824,893 | B1 | 11/2017 | Smith et al. |
| 11,114,305 | B2 | 9/2021 | Tanimoto |
| 2014/0073139 | A1 | 3/2014 | Suzuki |
| 2018/0233398 | A1 | 8/2018 | Van Cleemput et al. |
| 2021/0217627 | A1* | 7/2021 | Tanimoto .......... H01L 21/31116 |

FOREIGN PATENT DOCUMENTS

| | | | | |
|---|---|---|---|---|
| JP | 2001-044174 | * | 2/2001 | ......... H01L 21/3065 |
| JP | 2001-44174 | A | 2/2001 | |
| JP | 2002-506572 | A | 2/2002 | |
| JP | 2018-142698 | A | 9/2018 | |
| TW | 201842573 | A | 12/2018 | |
| TW | 201930648 | A | 8/2019 | |
| WO | 98/59379 | A1 | 12/1998 | |
| WO | 2012/124726 | A1 | 9/2012 | |
| WO | 2019/087850 | A1 | 5/2019 | |

OTHER PUBLICATIONS

International Search Report for PCT/JP2021/023959 dated Aug. 31, 2021.

* cited by examiner

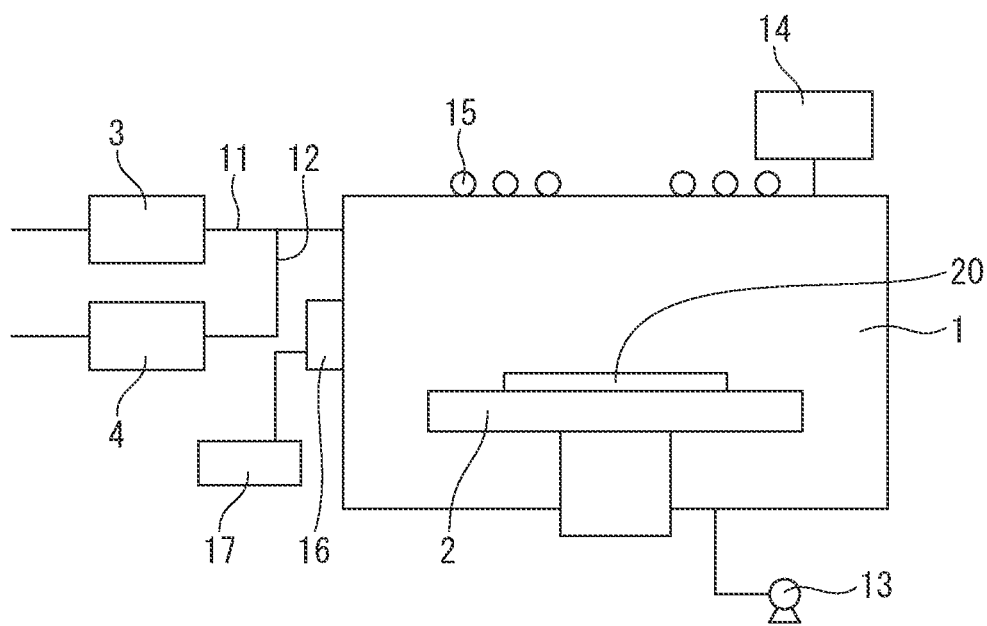

PLASMA ETCHING METHOD AND METHOD FOR MANUFACTURING SEMICONDUCTOR ELEMENT

CROSS REFERENCE TO RELATED APPLICATIONS

This application is a National Stage of International Application No. PCT/JP2021/023959 filed Jun. 24, 2021, claiming priority based on Japanese Patent Application No. 2020-145948 filed Aug. 31, 2020.

TECHNICAL FIELD

The present invention relates to a plasma etching method and a method for manufacturing a semiconductor element.

BACKGROUND ART

Metal oxides, such as tin oxide and indium oxide, are used as a spacer in forming a metal wiring pattern or forming a fin pattern in a fin field effect transistor (FinFET). Indium tin oxide (ITO) which is a mixture of tin oxide and indium oxide is frequently used in the manufacture of a transparent electrode.

In a process for manufacturing the semiconductors described above, the microfabrication of metal oxide into a desired shape involves a step of etching metal oxide by plasma etching using an etching gas. In the etching in the process for manufacturing the semiconductors, it is important to be able to selectively etch an etching object (metal oxide) to be etched by the etching gas compared to a non-etching object, such as mask, not to be etched by the etching gas (i.e., etching selectivity).

For example, PTL 1 and PTL 2 disclose technologies of etching metal oxide by plasma etching using an etching gas containing hydrogen bromide or hydrogen iodide.

CITATION LIST

Patent Literatures

PTL 1: JP 2002-506572 A
PTL 2: JP 6-151375 A

SUMMARY OF INVENTION

Technical Problem

However, the technologies disclosed in PTL 1 and PTL 2 have failed to etch metal oxides with excellent etching selectivity in some cases.

It is an object of the present invention to provide a plasma etching method capable of selectively etching an etching object containing oxide of at least one of tin and indium compared to a non-etching object and a method for manufacturing a semiconductor element.

Solution to Problem

To achieve the above-described object, one aspect of the present invention is as described in [1] to [9] below.

[1] A plasma etching method includes: an etching step of bringing an etching gas containing an unsaturated compound having a fluorine atom and a bromine atom in the molecule thereof into contact with a member to be etched including an etching object to be etched by the etching gas and a non-etching object not to be etched by the etching gas in the presence of plasma, performing etching while applying a bias power exceeding 0 W to a lower electrode supporting the member to be etched, and selectively etching the etching object compared to the non-etching object, in which the etching object contains oxide of at least one of tin and indium and the non-etching object contains at least one of a silicon-containing compound and a photoresist.

[2] The plasma etching method according to [1], in which the etching gas is a mixed gas containing an unsaturated compound and an inert gas.

[3] The plasma etching method according to [2], in which the concentration of the unsaturated compound in the mixed gas is 1% by volume or more and 50% by volume or less.

[4] The plasma etching method according to any one of [1] to [3], in which the unsaturated compound is bromofluoroethylene.

[5] The plasma etching method according to [4], in which the bromofluoroethylene is at least one of bromotrifluoroethylene, 1-bromo-2,2-difluoroethylene, (E)-1-bromo-1,2-difluoroethylene, (Z)-1-bromo-1,2-difluoroethylene, 1-bromo-1-fluoroethylene, (E)-1-bromo-2-fluoroethylene, (Z)-1-bromo-2-fluoroethylene, 1,1-dibromo-2-fluoroethylene, (E)-1,2-dibromo-2-fluoroethylene, (Z)-1,2-dibromo-2-fluoroethylene, and tribromofluoroethylene.

[6] The plasma etching method according to any one of [1] to [5], in which the silicon-containing compound is a compound having at least one of an oxygen atom and a nitrogen atom and a silicon atom or amorphous silicon.

[7] The plasma etching method according to any one of [1] to [6], in which the etching is performed under a process pressure of 1 Pa or more and 10 Pa or less.

[8] The plasma etching method according to any one of [1] to [7], in which the etching is performed while applying a bias power of 10 W or more and 1200 W or less to the lower electrode supporting the member to be etched.

[9] A method for manufacturing a semiconductor element for manufacturing a semiconductor element using the plasma etching method according to any one of [1] to [8], the member to be etched being a semiconductor substrate including the etching object and the non-etching object, and the method includes: a treatment step of removing at least a part of the etching object from the semiconductor substrate by the etching.

Advantageous Effects of Invention

According to the present invention, the etching object containing oxide of at least one of tin and indium can be selectively etched compared to the non-etching object.

BRIEF DESCRIPTION OF DRAWINGS

The FIGURE is a schematic view of one example of a plasma etching system for explaining one embodiment of a plasma etching method according to the present invention.

DESCRIPTION OF EMBODIMENTS

Hereinafter, one embodiment of the present invention will be described. This embodiment describes one example of the present invention, and the present invention is not limited to this embodiment. Further, this embodiment can be variously altered or modified and embodiments obtained by such alternations or modifications may also be included in the present invention.

A plasma etching method according to this embodiment includes an etching step of bringing an etching gas containing an unsaturated compound having a fluorine atom and a bromine atom in the molecule thereof into contact with a member to be etched including an etching object to be etched by the etching gas and a non-etching object not to be etched by the etching gas in the presence of plasma, performing etching while applying a bias power exceeding 0 W to a lower electrode supporting the member to be etched, and selectively etching the etching object compared to the non-etching object. The etching object contains oxide of at least one of tin (Sn) and indium (In) and the non-etching object contains at least one of a silicon-containing compound and a photoresist.

When the etching gas is brought into contact with the member to be etched, the unsaturated compound in the etching gas and the oxide in the etching object react with each other, and therefore the etching of the etching object proceeds. In contrast thereto, the non-etching object hardly reacts with the above-described unsaturated compound, and therefore the etching of the non-etching object hardly proceeds. Therefore, according to the plasma etching method of this embodiment, the etching object can be selectively etched compared to the non-etching object.

For example, the etching can be performed such that a ratio of the etching rate of the etching object to the etching rate of the non-etching object is 2 or more. From the viewpoint of more stably controlling the etching, the etching can be performed such that the etching rate ratio is 4 or more.

The etching in the present invention means processing the member to be etched into a predetermined shape (e.g., three-dimensional shape) by removing a part or the entire of the etching object possessed by the member to be etched (e.g., processing a film-like etching object containing the above-described oxide possessed by the member to be etched to have a predetermined film thickness) and means removing residues or deposits containing the etching object from the member to be etched for cleaning, for example.

The plasma etching method according to this embodiment can be utilized for the manufacture of semiconductor elements. More specifically, the method for manufacturing a semiconductor element according to this embodiment is a method for manufacturing a semiconductor element using the plasma etching method according to this embodiment. The member to be etched is a semiconductor substrate including the etching object and the non-etching object. The method includes a treatment step of removing at least a part of the etching object from the semiconductor substrate by the etching.

Therefore, the application of the plasma etching method according to this embodiment to a process for manufacturing a semiconductor element enables the transfer of a pattern formed on a photoresist to a film of metal oxide or the removal of a film or a residue of metal oxide present on a film of the non-etching object, for example.

Hereinafter, the plasma etching method and the method for manufacturing a semiconductor element according to this embodiment are described in more detail below.

The etching of this embodiment can be achieved by the plasma etching. The type of a plasma source in the plasma etching is not particularly limited, and a commercially available device may be used. For example, high frequency discharge plasma, such as inductively coupled plasma (ICP) and capacitively coupled plasma (CCP), and microwave discharge plasma, such as electron cyclotron resonance plasma (ECRP), are mentioned.

A plasma etching system in the FIGURE described later is a plasma etching system using the ICP as the plasma source.

In the plasma etching method according to this embodiment, it may be acceptable that a plasma generating chamber and a chamber where the member to be etched is installed are separated, and the plasma is generated in the plasma generating chamber (i.e., remote plasma may be used).

[Etching Gas]

The etching gas used in the plasma etching method according to this embodiment is the gas containing the unsaturated compound having a fluorine atom and a bromine atom in the molecule thereof. The type of the unsaturated compound is not particularly limited insofar as it has a fluorine atom and a bromine atom in the molecule thereof, and bromofluoroethylene which is easy to obtain and easy to handle is preferable.

Specific examples of the bromofluoroethylene include bromotrifluoroethylene, 1-bromo-2,2-difluoroethylene, (E)-1-bromo-1,2-difluoroethylene, (Z)-1-bromo-1,2-difluoroethylene, 1-bromo-1-fluoroethylene, (E)-1-bromo-2-fluoroethylene, (Z)-1-bromo-2-fluoroethylene, 1,1-dibromo-2-fluoroethylene, (E)-1,2-dibromo-2-fluoroethylene, (Z)-1,2-dibromo-2-fluoroethylene, and tribromofluoroethylene.

Among the above, bromofluoroethylene having one bromine atom is more preferable from the viewpoint that the bromofluoroethylene can be easily vaporized at normal temperature and normal pressure. Examples of the bromofluoroethylene having one bromine atom include bromotrifluoroethylene, 1-bromo-2,2-difluoroethylene, (E)-1-bromo-1,2-difluoroethylene, (Z)-1-bromo-1,2-difluoroethylene, 1-bromo-1-fluoroethylene, (E)-1-bromo-2-fluoroethylene, and (Z)-1-bromo-2-fluoroethylene.

The unsaturated compound, such as bromofluoroethylene, may be used alone or in combination of two or more types thereof.

The etching gas may be a gas formed of only the unsaturated compound, such as bromofluoroethylene, and may be a mixed gas containing the unsaturated compound, such as bromofluoroethylene, and an inert gas or may be a mixed gas containing the unsaturated compound, such as bromofluoroethylene, an oxygen atom-containing gas, and an inert gas.

The type of the inert gas is not particularly limited, and a nitrogen gas ($N_2$), helium (He), neon (Ne), argon (Ar), krypton (Kr), and xenon (Xe) are mentioned, for example. These inert gases may be used alone or in combination of two or more types thereof.

The oxygen atom-containing gas is not particularly limited insofar as it has an oxygen atom in the molecule thereof and is a gaseous compound in the standard state. For example, an oxygen gas ($O_2$), ozone ($O_3$), nitrous oxide ($N_2O$), nitrogen monoxide (NO), nitrogen dioxide ($NO_2$), sulfur dioxide ($SO_2$), sulfur trioxide ($SO_3$), and the like are mentioned. By adding the oxygen atom-containing gas, the film thickness of a polymer deposited on the non-etching object can be controlled to a desired thickness in some cases.

The concentration of the unsaturated compound in the mixed gas is not particularly limited and can be set to more than 0% by volume and less than 100% by volume. The concentration may be adjusted considering the ignitability or the like of the plasma. To achieve more sufficient ignitability of the plasma, the concentration of the unsaturated compound in the mixed gas is preferably set to 1% by volume or more and 50% by volume or less, more preferably set to 1% by volume or more and 40% by volume or less, still more preferably set to 3% by volume or more and 30% by volume or less, and particularly preferably set to 5% by volume or more and 30% by volume or less.

When the concentration of the unsaturated compound in the mixed gas is within the numerical ranges above, a high etching selection ratio is likely to be realized, and the etching selection ratio is likely to be 3 or more, for example. Herein, the etching selection ratio is a value calculated by dividing the etching rate of the etching object by the etching rate of the non-etching object.

The usage amount of the etching gas in the plasma etching method according to this embodiment, e.g., the total flow rate of the etching gas to a chamber where the plasma etching is performed in the plasma etching system, may be adjusted according to the internal volume, the exhaust capacity, the process pressure, or the like of the chamber.

[Conditions of Etching Step]

The pressure condition of the etching step in the plasma etching method according to this embodiment is not particularly limited. The plasma etching is performed preferably under a process pressure of 0.2 Pa or more and Pa or less, more preferably under a process pressure of 1 Pa or more and 15 Pa or less, still more preferably under a process pressure of 1 Pa or more and 10 Pa or less, and particularly preferably under a process pressure of 2 Pa or more and 8 Pa or less. Within the pressure ranges above, the composition of the plasma is stabilized, and therefore the reproducibility of the etching is easily enhanced.

In the plasma etching system, a high frequency source power is applied to a radio frequency (RF) coil to form an electric field and a magnetic field, so that the etching gas is converted into plasma, and plasma can be generated, for example. The magnitude of the source power is not particularly limited and is preferably set to more than 0 W and 3000 W or less, more preferably set to 100 W or more and 1500 W or less, and still more preferably set to 200 W or more and 1000 W or less. When the magnitude of the source power is within the numerical ranges above, the etching rate of the etching object becomes sufficiently high and the etching selection ratio becomes sufficiently high.

The temperature condition of the etching step in the plasma etching method according to this embodiment is not particularly limited. The temperature of the member to be etched (for example, semiconductor substrate) in the plasma etching is preferably set to −20° C. or more and 250° C. or less, more preferably set to 0° C. or more and 100° C. or less, and still more preferably set to 20° C. or more and 70° C. or less. When the temperature of the member to be etched in the plasma etching is within the numerical ranges above, the deformation of a resist film formed on the semiconductor substrate due to deterioration, sublimation, or the like is suppressed, and therefore the plasma etching can be performed with high patterning accuracy, for example. Herein, the temperature of the temperature condition above is the temperature of the member to be etched, and the temperature of a stage supporting the member to be etched installed in the chamber of the plasma etching system is also usable.

The plasma etching requires the application of a bias power exceeding 0 W to the lower electrode supporting the member to be etched. To achieve sufficiently high etching selection ratio of the etching object with respect to the non-etching object, the bias power applied to the lower electrode is preferably set to 10 W or more and 1200 W or less, more preferably set to 20 W or more and 800 W or less, still more preferably set to 20 W or more and 500 W or less, and particularly preferably set to 30 W or more and 300 W or less.

[Member to be Etched]

The member to be etched which is to be etched by the plasma etching method according to this embodiment has the etching object and the non-etching object, and may be a member having a part formed of the etching object and a part formed of the non-etching object or a member formed of a mixture of the etching object and the non-etching object. The member to be etched may have substances other than the etching object and the non-etching object.

The shape of the member to be etched is not particularly limited, and may be a plate shape, a foil shape, a film shape, a powder shape, or a block shape, for example. As the member to be etched, the semiconductor substrate described above is mentioned.

[Etching Object]

The etching object contains oxide of at least one of tin and indium, i.e., tin oxide, indium oxide, or indium tin oxide. Examples of the tin oxide include $SnO$ and $SnO_2$. Examples of the indium oxide includes $In_2O_3$. The etching object may be formed of only the oxide above, may have a part formed of only the oxide above and a part containing the other materials, or may be formed of a mixture of the oxide above and the other materials.

The etching object may be not only a material substantially containing only specific metals (tin, indium) alone or a compound thereof but a material containing specific metals alone or a compound thereof in a proportion of 10% by mole or more, more preferably 20% by mole or more, and still more preferably 30% by mole or more. For example, the plasma etching method according to this embodiment is also applicable to alloys with the other metals, materials containing impurities, oxides, nitrides, oxynitrides, oxyfluorides, and the like.

The oxides used herein refer to compounds having metals and oxygen. The oxides are compounds represented by $M_xO_y$ (M is tin or indium, x and y are arbitrary natural numbers) and compounds containing at least metals in a proportion of 10% by mole or more, more preferably 15% by mole or more, and still more preferably 20% by mole or more, for example. Specifically, compounds represented by $MO$, $M_2O_3$, $MO_2$, $MO_3$, $M_3O_4$, and $M_2O_5$ and the like are mentioned.

The nitrides used herein refer to compounds having metals and nitrogen. The nitrides are compounds represented by $M_aN_b$ (M is tin or indium, a and b are arbitrary natural numbers) and compounds containing at least metals in a proportion of 10% by mole or more, more preferably 15% by mole or more, and still more preferably 20% by mole or more, for example. Specifically, compounds represented by $MN$, $M_2N$, $M_3N_2$, $M_3N_4$, $M_4N$, $M_7N_3$, and $M_{16}N_2$ and the like are mentioned.

Further, the oxynitrides used herein refer to compounds having metals, oxygen, and nitrogen. The oxynitrides are compounds represented by $M_cN_dO_e$ (M is tin or indium, c, d, e are arbitrary natural numbers) and compounds containing at least metals in a proportion of 10% by mole or more, more preferably 15% by mole or more, and still more preferably 20% by mole or more, for example.

The oxyfluorides used herein refer to compounds having metals, oxygen, and fluorine. The oxyfluorides are compounds represented by $M_fF_gO_h$ (M is tin or indium, f, g, h are arbitrary natural numbers) and compounds containing at least metals in a proportion of 10% by mole or more, more preferably 15% by mole or more, and still more preferably 20% by mole or more, for example.

The shape of the material containing specific metals is not particularly limited and may be a granular shape, a block shape, a film shape, a foil shape, or a powder shape.

[Non-Etching Object]

The non-etching object contains at least one of a silicon-containing compound and a photoresist. The non-etching object does not substantially react with the above-described unsaturated compound or extremely slowly react with the above-described unsaturated compound, and therefore, even when the etching is performed by the plasma etching method according to this embodiment, the etching hardly proceeds. Or, the vapor pressure of a reaction product of the above-described unsaturated compound and the non-etching object is low, and therefore the etching hardly proceeds.

The type of the silicon-containing compound is not particularly limited insofar as it is a compound having a silicon atom. Examples include compounds having at least one of an oxygen atom and a nitrogen atom and a silicon atom, polysilicon, and amorphous silicon (Si). As the compounds having at least one of an oxygen atom and a nitrogen atom and a silicon atom, silicon oxides, silicon nitrides, and silicon oxynitrides are mentioned, for example.

The silicon oxides refer to compounds having silicon and oxygen in an arbitrary ratio, and silicon dioxide ($SiO_2$) can be mentioned as an example. The purity of the silicon oxides is not particularly limited and is preferably 30% by mass or more, more preferably 60% by mass or more, and still more preferably 90% by mass or more.

The silicon nitrides refer to compounds having silicon and nitrogen in an arbitrary ratio, and $Si_3N_4$ can be mentioned as an example. The purity of the silicon nitrides is not particularly limited and is preferably 30% by mass or more, more preferably 60% by mass or more, and still more preferably 90% by mass or more.

The silicon oxynitrides refers to compounds having silicon, oxygen, and nitrogen in arbitrary ratio and $Si_2N_2O$ can be mentioned as an example.

The photoresist means a photosensitive composition having physical properties including solubility changed by light, electron beams, or the like. For example, photoresists for g-line, h-line, i-line, KrF, ArF, F2, and EUV are mentioned. The composition of the photoresist is not particularly limited insofar as it is generally used in a semiconductor element manufacturing step. For example, compositions are mentioned which contain polymers synthesized from at least one type of monomer selected from chain olefin, cyclic olefin, styrene, vinyl phenol, acrylic acid, methacrylate, epoxy, melamine, and glycol.

The non-etching object is usable as a resist or a mask for suppressing the etching of the etching object by the etching gas. Therefore, the plasma etching method according to this embodiment can be utilized for a method for processing the etching object into a predetermined shape (e.g., processing a film-like etching object possessed by the member to be etched to have a predetermined film thickness) utilizing the non-etching object after patterned as a resist or a mask, for example, and therefore can be suitably used for the manufacture of a semiconductor element. The non-etching object is hardly etched, and therefore the etching of a portion which should not be etched of the semiconductor element can be suppressed, and thus the loss of the properties of the semiconductor element due to the etching can be prevented.

The non-etching objects remaining after patterning can be removed by a removal method generally used in the semiconductor element manufacturing step. For example, ashing using oxidizing gases, such as oxygen plasma and ozone, and dissolution and removal using chemical solutions, such as APM (mixture of ammonia water and hydrogen peroxide solution), SPM (mixture of sulfuric acid and hydrogen peroxide solution), and organic solvents, are mentioned.

The following description describes an example of performing plasma etching of a tin oxide film, an amorphous silicon film, a silicon oxide film, a silicon nitride film, and a photoresist film formed on the surface of the substrate (equivalent to the member to be etched) using the plasma etching system illustrated in the FIGURE. The plasma etching system in the FIGURE is a plasma etching system using the ICP as the plasma source. First, the plasma etching system in the FIGURE is described.

The plasma etching system in the FIGURE includes: a chamber 1 in which the plasma etching is performed; a lower electrode 2 supporting a substrate 20 to be subjected to the plasma etching inside the chamber 1; a power supply for bias power (not illustrated) applying a bias power to the lower electrode 2; RF coils 15 forming an electric field and a magnetic field inside the chamber 1 converting the etching gas into plasma; a power supply for source power (not illustrated) applying a high frequency source power to the RF coils 15; a vacuum pump 13 reducing the pressure inside the chamber 1; a pressure gauge 14 measuring the pressure inside the chamber 1; a sensor 16 capturing the plasma emission accompanying the generation of the plasma; and a spectroscope 17 splitting the plasma emission captured by the sensor 16 and monitoring changes with time of the plasma emission.

The substrate 20 has a tin oxide film, an amorphous silicon film, a silicon oxide film, a silicon nitride film, and a photoresist film formed on the surface. As the sensor 16, a CCD (charge-coupled device) image sensor is usable, for example. However, it may be acceptable that an observation hole is provided in the chamber 1 instead of providing the sensor 16 and the spectroscope 17, and the inside of the chamber 1 is visually observed through the observation hole to confirm the changes with time of the plasma emission.

The chamber 1 further includes an etching gas supply unit supplying the etching gas into the chamber 1. The etching gas supply unit includes: an unsaturated compound gas supply unit 3 supplying an unsaturated compound gas; an inert gas supply unit 4 supplying an inert gas; etching gas supply piping 11 connecting the unsaturated compound gas supply unit 3 and the chamber 1; and inert gas supply piping 12 connecting the inert gas supply unit 4 to an intermediate part of the etching gas supply piping 11.

When the unsaturated compound gas is supplied as the etching gas to the chamber 1, the unsaturated compound gas is sent from the unsaturated compound gas supply unit 3 to the etching gas supply piping 11, so that the unsaturated compound gas is supplied to the chamber 1 via the etching gas supply piping 11.

The pressure in the chamber 1 before supplying the etching gas is not particularly limited insofar as it is equal to or lower than the supply pressure of the etching gas or lower than the supply pressure of the etching gas, and is preferably $10^{-5}$ Pa or more and less than 100 kPa, more preferably 1 Pa or more and 50 kPa or less, and still more preferably 1 Pa or more and 20 kPa or less, for example.

When a mixed gas of the unsaturated compound gas and the inert gas is supplied as the etching gas, the unsaturated compound gas is sent from the unsaturated compound gas supply unit 3 to the etching gas supply piping 11 and the inert gas is sent from the inert gas supply unit 4 to the etching gas supply piping 11 via the inert gas supply piping 12. Thus, the unsaturated compound gas and the inert gas are mixed in the intermediate part of the etching gas supply piping 11 to form a mixed gas, and the mixed gas is supplied to the chamber 1 via the etching gas supply piping 11.

When the plasma etching is performed using such a plasma etching system, the substrate 20 is placed on the lower electrode 2 arranged inside the chamber 1, the pressure inside the chamber 1 is reduced to 1 Pa or more and 10 Pa or less, for example, by the vacuum pump 13, and then the etching gas is supplied into the chamber 1 by the etching gas supply unit. Then, when a high frequency (for example, 13.56 MHz) source power is applied to the RF coils 15, an electric field and a magnetic field are formed inside the chamber 1, so that electrons are accelerated. Then, the accelerated ions collide with unsaturated compound molecules in the etching gas to generate new ions and electrons, so that an electric discharge occurs and plasma is formed. The generation of the plasma can be confirmed using the sensor 16 and the spectroscope 17.

The generation of the plasma causes the etching of the tin oxide film formed on the surface of the substrate 20. The supply amount of the etching gas to the chamber 1 and the concentration of the unsaturated compound in the etching gas (mixed gas) can be adjusted by controlling the flow rates of the unsaturated compound gas and the inert gas, respectively, with mass flow controllers (not illustrated) installed in the etching gas supply piping 11 and the inert gas supply piping 12, respectively.

The pressure of the etching gas supplied into the chamber 1 is preferably 0.01 Pa or more and 500 Pa or less, more preferably 0.1 Pa or more and 100 Pa or less, still more preferably 1 Pa or more and 30 Pa or less, and particularly preferably 1 Pa or more and 10 Pa or less from the viewpoint of uniformly etching the surface of the substrate 20. When the pressure of the etching gas in the chamber 1 is within the ranges above, the etching object is likely to be etched at a sufficient rate and the etching rate ratio of the etching object to the non-etching object, i.e., the etching selection ratio, is likely to be higher.

EXAMPLES

Hereinafter, the present invention is described in more detail with reference to Examples and Comparative Examples below.

Example 1

The plasma etching of five different types of substrates was carried out using an ICP etching system RIE-200iP manufactured by Samco Inc., which has substantially the same configuration as that of the plasma etching system in the FIGURE. A First Substrate was obtained by forming a 300 nm thick tin oxide ($SnO_2$) film on a square silicon substrate of 2 inches per side (manufactured by Seiren KST Co.). A second substrate was obtained by forming an 800 nm thick amorphous silicon film on a square silicon substrate of 2 inches per side (manufactured by Seiren KST Co.).

A third substrate was obtained by forming a 600 nm thick silicon oxide ($SiO_2$) film on a square silicon substrate of 2 inches per side (manufactured by Seiren KST Co.). A fourth substrate was obtained by forming an 800 nm thick silicon nitride ($Si_3N_4$) film on a square silicon substrate of 2 inches per side (manufactured by Seiren KST Co.).

A fifth substrate was obtained by forming a 600 nm thick photoresist film on a square silicon substrate of 2 inches per side. The photoresist film was formed by applying a photoresist for i-line TSCR (registered trademark) manufactured by TOKYO OHKA KOGYO CO., LTD. onto a silicon substrate, followed by exposing and curing.

The tin oxide film is the etching object and the amorphous silicon film, the silicon oxide film, the silicon nitride film, and the photoresist film are the non-etching objects.

The volume inside the chamber is 46000 $cm^3$ and the etching gas is a mixed gas of a bromotrifluoroethylene gas and argon. By setting the flow rate of the bromotrifluoroethylene gas to 10 sccm and setting the flow rate of the argon to 90 sccm, the concentration of the bromotrifluoroethylene in the etching gas was adjusted to 10% by volume. Herein, the "sccm" is the volumetric flow rate ($cm^3$) per minute normalized under the conditions of 0° C. and 1 atm.

The process pressure inside the chamber was set to 3 Pa, the source power was set to 600 W, the bias power was set to 200 W, and the temperature of the substrate was set to 20° C. Then, the plasma etching was performed while constantly monitoring each of the flow rate of the bromotrifluoroethylene gas, the flow rate of the argon, the process pressure, the source power, and the bias power and confirming that there was no difference between the set value and the execution value. The results are shown in Table 1.

Table 1 shows the etching rate of each of the etching object and the non-etching objects and the ratio of the etching rate of the etching object to the etching rate of the non-etching object ([Etching rate of non-etching object]/[Etching rate of etching object], hereinafter referred to as "etching selection ratio").

TABLE 1

| | Etching gas | | Stage | Pressure in | Source | Bias | | | | Etching |
| | | Flow rate | temperature | chamber | power | power | Etching rate (nm/min) | | | selection |
| | Composition | (mL/min)) | (° C.) | (Pa) | (W) | (W) | Etching object | | Non-etching object | ratio |
|---|---|---|---|---|---|---|---|---|---|---|
| Ex. 1 | Bromotrifluo-roethylene/Ar | 10/90 | 20 | 3 | 600 | 200 | Tin oxide | 71 | Silicon oxide 22 | 3.2 |
| | | | | | | | | | Silicon nitride 15 | 4.7 |
| | | | | | | | | | Amorphous silicon 3 | 23.7 |
| | | | | | | | | | Photoresist 1 | 71.0 |
| Ex. 2 | Bromotrifluo-roethylene/Ar | 10/90 | 20 | 3 | 600 | 200 | Indium oxide | 52 | Silicon oxide 22 | 2.4 |
| | | | | | | | | | Silicon nitride 15 | 3.5 |
| | | | | | | | | | Amorphous silicon 3 | 17.3 |
| | | | | | | | | | Photoresist 1 | 52.0 |
| Ex. 3 | Bromotrifluo-roethylene/Ar | 10/90 | 20 | 3 | 600 | 200 | Indium tin oxide | 67 | Silicon oxide 22 | 3.0 |
| | | | | | | | | | Silicon nitride 15 | 4.5 |
| | | | | | | | | | Amorphous silicon 3 | 22.3 |
| | | | | | | | | | Photoresist 1 | 67.0 |

TABLE 1-continued

| | Etching gas | | Stage temperature (° C.) | Pressure in chamber (Pa) | Source power (W) | Bias power (W) | Etching rate (nm/min) | | | | Etching selection ratio |
|---|---|---|---|---|---|---|---|---|---|---|---|
| | Composition | Flow rate (mL/min)) | | | | | Etching object | | Non-etching object | | |
| Ex. 4 | Bromotrifluo-roethylene/Ar | 10/90 | 0 | 3 | 600 | 200 | Tin oxide | 55 | Silicon oxide | 9 | 6.1 |
| | | | | | | | | | Silicon nitride | 6 | 9.2 |
| | | | | | | | | | Amorphous silicon | 1 | 55.0 |
| | | | | | | | | | Photoresist | 1 | 55.0 |
| Ex. 5 | Bromotrifluo-roethylene/Ar | 10/90 | 50 | 3 | 600 | 200 | Tin oxide | 88 | Silicon oxide | 42 | 2.1 |
| | | | | | | | | | Silicon nitride | 33 | 2.7 |
| | | | | | | | | | Amorphous silicon | 7 | 12.6 |
| | | | | | | | | | Photoresist | 4 | 22.0 |
| Ex. 6 | Bromotrifluo-roethylene/Ar | 10/90 | 20 | 3 | 300 | 200 | Tin oxide | 115 | Silicon oxide | 56 | 2.1 |
| | | | | | | | | | Silicon nitride | 40 | 2.9 |
| | | | | | | | | | Amorphous silicon | 12 | 9.6 |
| | | | | | | | | | Photoresist | 7 | 16.4 |
| Ex. 7 | Bromotrifluo-roethylene/Ar | 10/90 | 20 | 3 | 1000 | 200 | Tin oxide | 11 | Silicon oxide | 4 | 2.8 |
| | | | | | | | | | Silicon nitride | 4 | 2.8 |
| | | | | | | | | | Amorphous silicon | Polymer deposited | Exceeded 100 |
| | | | | | | | | | Photoresist | Polymer deposited | Exceeded 100 |
| Ex. 8 | Bromotrifluo-roethylene/Ar | 10/90 | 20 | 3 | 600 | 30 | Tin oxide | 17 | Silicon oxide | 1 | 17.0 |
| | | | | | | | | | Silicon nitride | 2 | 8.5 |
| | | | | | | | | | Amorphous silicon | Polymer deposited | Exceeded 100 |
| | | | | | | | | | Photoresist | Polymer deposited | Exceeded 100 |
| Ex. 9 | Bromotrifluo-roethylene/Ar | 10/90 | 20 | 10 | 600 | 200 | Tin oxide | 76 | Silicon oxide | 3 | 25.3 |
| | | | | | | | | | Silicon nitride | 4 | 19.0 |
| | | | | | | | | | Amorphous silicon | 1 | 76.0 |
| | | | | | | | | | Photoresist | Polymer deposited | Exceeded 100 |

The film thicknesses of the etching object and the non-etching objects were measured using a reflectance spectroscopic film thickness meter F20 manufactured by Filmetrics. The etching rates of the etching object and the non-etching objects were calculated by subtracting the film thickness after the etching from the film thickness before the etching and dividing the obtained value by an etching time. The film thickness measurement conditions are as follows.

The measurement is performed in the air atmosphere, and the measurement temperature is 25° C. The measurement wavelength range is a wavelength range in which the Goodness of fit is 0.9 or more. Specifically, the measurement was performed with the following wavelength ranges as a guide. More specifically, the wavelength range for the tin oxide is 350 to 700 nm, the wavelength range for the amorphous silicon is 500 to 1200 nm, the wavelength range for the silicon oxide is 300 to 1100 nm, the wavelength range for the silicon nitride is 500 to 1500 nm, and the wavelength range for the photoresist is 400 to 1000 nm.

Examples 2 to 15

The plasma etching was performed in the same manner as in Example 1, except that the etching conditions were as shown in Tables 1, 2, and the etching rates and the etching selection ratios of the etching objects and the non-etching objects were measured. The results are shown in Tables 1, 2.

TABLE 2

| | Etching gas | | Stage temperature (° C.) | Pressure in chamber (Pa) | Source power (W) | Bias power (W) | Etching rate (nm/min) | | | | Etching selection ratio |
|---|---|---|---|---|---|---|---|---|---|---|---|
| | Composition | Flow rate (mL/min)) | | | | | Etching object | | Non-etching object | | |
| Ex. 10 | Bromotrifluo-roethylene/Ar | 3/97 | 20 | 3 | 600 | 200 | Tin oxide | 41 | Silicon oxide | 9 | 4.6 |
| | | | | | | | | | Silicon nitride | 4 | 10.3 |
| | | | | | | | | | Amorphous silicon | 1 | 41.0 |
| | | | | | | | | | Photoresist | 1 | 41.0 |
| Ex. 11 | Bromotrifluo-roethylene/Ar | 30/70 | 20 | 3 | 600 | 200 | Tin oxide | 139 | Silicon oxide | 40 | 3.5 |
| | | | | | | | | | Silicon nitride | 30 | 4.6 |
| | | | | | | | | | Amorphous silicon | 5 | 27.8 |
| | | | | | | | | | Photoresist | 3 | 46.3 |
| Ex. 12 | 1-bromo-1-fluo-loethylene/Ar | 10/90 | 20 | 3 | 600 | 200 | Tin oxide | 89 | Silicon oxide | 31 | 2.9 |
| | | | | | | | | | Silicon nitride | 14 | 6.4 |
| | | | | | | | | | Amorphous silicon | Polymer deposited | Exceeded 100 |
| | | | | | | | | | Photoresist | Polymer deposited | Exceeded 100 |

TABLE 2-continued

| | Etching gas | | Stage temperature | Pressure in chamber | Source power | Bias power | Etching rate (nm/min) | | | | Etching selection ratio |
|---|---|---|---|---|---|---|---|---|---|---|---|
| | Composition | Flow rate (mL/min)) | (° C.) | (Pa) | (W) | (W) | Etching object | | Non-etching object | | |
| Ex. 13 | 1-bromo-2,2-difluoroethylene/Ar | 10/90 | 20 | 3 | 600 | 200 | Tin oxide | 79 | Silicon oxide | 22 | 3.6 |
| | | | | | | | | | Silicon nitride | 10 | 7.9 |
| | | | | | | | | | Amorphous silicon | 2 | 39.5 |
| | | | | | | | | | Photoresist | 1 | 79.0 |
| Ex. 14 | (E)-1-bromo-2-fluoroethylene/Ar | 10/90 | 20 | 3 | 600 | 200 | Tin oxide | 75 | Silicon oxide | 19 | 3.9 |
| | | | | | | | | | Silicon nitride | 12 | 6.3 |
| | | | | | | | | | Amorphous silicon | 2 | 37.5 |
| | | | | | | | | | Photoresist | 1 | 75.0 |
| Ex. 15 | (Z)-1-bromo-2-fluoroethylen/Ar | 10/90 | 20 | 3 | 600 | 200 | Tin oxide | 73 | Silicon oxide | 15 | 4.9 |
| | | | | | | | | | Silicon nitride | 9 | 8.1 |
| | | | | | | | | | Amorphous silicon | 2 | 36.5 |
| | | | | | | | | | Photoresist | 1 | 73.0 |
| Comp. Ex. 1 | $SF_6$/Ar | 10/90 | 20 | 3 | 600 | 200 | Tin oxide | 12 | Silicon oxide | 59 | 0.2 |
| | | | | | | | | | Silicon nitride | 81 | 0.1 |
| | | | | | | | | | Amorphous silicon | 402 | 0.03 |
| | | | | | | | | | Photoresist | 93 | 0.1 |
| Comp. Ex. 2 | Hexafluorobutadiene/Ar | 10/90 | 20 | 3 | 600 | 200 | Tin oxide | 42 | Silicon oxide | 84 | 0.5 |
| | | | | | | | | | Silicon nitride | 72 | 0.6 |
| | | | | | | | | | Amorphous silicon | 48 | 0.9 |
| | | | | | | | | | Photoresist | 20 | 2.1 |
| Comp. Ex. 3 | HBr/Ar | 10/90 | 20 | 3 | 600 | 200 | Tin oxide | 59 | Silicon oxide | 50 | 1.2 |
| | | | | | | | | | Silicon nitride | 59 | 1.0 |
| | | | | | | | | | Amorphous silicon | 289 | 0.2 |
| | | | | | | | | | Photoresist | 48 | 1.2 |
| Comp. Ex. 4 | Bromotrifluoroethylene/Ar | 10/90 | 20 | 3 | 600 | 0 | Tin oxide | Polymer deposited | Silicon oxide | Polymer deposited | — |
| | | | | | | | | | Silicon nitride | Polymer deposited | — |
| | | | | | | | | | Amorphous silicon | Polymer deposited | — |
| | | | | | | | | | Photoresist | Polymer deposited | — |

Comparative Examples 1 to 3

The plasma etching was performed in the same manner as in Example 1, except for changing the bromotrifluoroethylene in the etching gas to a sulfur hexafluoride ($SF_6$) gas, a hexafluorobutadiene ($C_4F_6$) gas, and a hydrogen bromide (HBr) gas, and the etching rates and the etching selection ratios of the etching objects and the non-etching objects were measured. The results are shown in Table 2.

Comparative Example 4

The plasma etching was performed in the same manner as in Example 1, except for setting the bias power to 0 W, and the etching rate and the etching selection ratio of the etching object and the non-etching objects were measured. The results are shown in Table 2.

The results of Examples 1 to 3 show that the use of bromotrifluoroethylene as the etching gas enables the selective etching of tin oxide, indium oxide, and indium tin oxide with respect to the non-etching objects.

The results of Example 1, 4, 5 show that the higher the stage temperature, the higher the etching rate of tin oxide. On the other hand, it is found that the lower the stage temperature, the more the etching of the non-etching object is suppressed, and therefore the etching selection ratio is higher.

The results of Example 1, 6, 7 show that the lower the source power, the higher the etching rate of tin oxide. This suggests that the higher the source power, the more chemical species inhibiting the etching are generated.

The results of Examples 1, 8 and Comparative Example 4 show that, when the bias power is lowered, the etching of the non-etching object is suppressed, and thus the etching selection ratio increases. In particular, a polymer formed by the polymerization of bromotrifluoroethylene was deposited on the amorphous silicon film and the photoresist film, and therefore the etching of the amorphous silicon film and the photoresist film was suppressed. Therefore, it is considered that, for the amorphous silicon and the photoresist, a particularly high etching selection ratio to tin oxide is developed.

The results of Examples 1, 9 show that, even when the pressure in the chamber is increased, influence on the etching rate of tin oxide is small, whereas the etching rate of the non-etching objects is reduced. As a result, the etching selection ratio was improved.

The results of Examples 10, 11 show that the higher the ratio of bromofluoroethylene in the etching gas, the higher the etching rate of tin oxide.

The results of Examples 12 to 15 show that, even when 1-bromo-1-fluoroethylene, 1-bromo-2,2-difluoroethylene, (E)-1-bromo-2-fluoroethylene, and (Z)-1-bromo-2-fluoroethylene were used for the etching gas, the selective etching of tin oxide can be carried out without any problem.

The results of Comparative Example 1 to 3 show that, when sulfur hexafluoride, hexafluorobutadiene, and hydrogen bromide were used for the etching gas, the etching rate and the etching selection ratio of tin oxide tend to be lower.

REFERENCE SIGNS LIST 1 chamber
2 lower electrode 3 unsaturated compound gas supply unit
4 inert gas supply unit
11 etching gas supply piping
12 inert gas supply piping
13 vacuum pump
14 pressure gauge
15 RF coil
16 sensor
17 spectroscope
20 substrate

The invention claimed is:

1. A plasma etching method comprising:
an etching step of bringing an etching gas containing an unsaturated compound having a fluorine atom and a bromine atom in a molecule of the unsaturated compound into contact with a member to be etched including an etching object to be etched by the etching gas and a non-etching object not to be etched by the etching gas in a presence of plasma, performing etching while applying a bias power exceeding 0 W to a lower electrode supporting the member to be etched, and selectively etching the etching object compared to the non-etching object, wherein
the etching object contains oxide of at least one of tin and indium and the non-etching object contains at least one of a silicon-containing compound and a photoresist.

2. The plasma etching method according to claim 1, wherein the etching gas is a mixed gas containing an unsaturated compound and a gas selected from the group consisting of nitrogen gas, helium, neon, argon, krypton and xenon.

3. The plasma etching method according to claim 2, wherein a concentration of the unsaturated compound in the mixed gas is 1% by volume or more and 50% by volume or less.

4. The plasma etching method according to claim 3, wherein the unsaturated compound is bromofluoroethylene.

5. The plasma etching method according to claim 3, wherein the silicon-containing compound is a compound having at least one of an oxygen atom and a nitrogen atom and a silicon atom, or amorphous silicon.

6. The plasma etching method according to claim 3, wherein the etching is performed under a process pressure of 1 Pa or more and 10 Pa or less.

7. The plasma etching method according to claim 2, wherein the unsaturated compound is bromofluoroethylene.

8. The plasma etching method according to claim 2, wherein the silicon-containing compound is a compound having at least one of an oxygen atom and a nitrogen atom and a silicon atom, or amorphous silicon.

9. The plasma etching method according to claim 2, wherein the etching is performed under a process pressure of 1 Pa or more and 10 Pa or less.

10. The plasma etching method according to claim 1, wherein the unsaturated compound is bromofluoroethylene.

11. The plasma etching method according to claim 10, wherein the bromofluoroethylene is at least one of bromotrifluoroethylene, 1-bromo-2,2-difluoroethylene, (E)-1-bromo-1,2-difluoroethylene, (Z)-1-bromo-1,2-difluoroethylene, 1-bromo-1-fluoroethylene, (E)-1-bromo-2-fluoroethylene, (Z)-1-bromo-2-fluoroethylene, 1,1-dibromo-2-fluoroethylene, (E)-1,2-dibromo-2-fluoroethylene, (Z)-1,2-dibromo-2-fluoroethylene, and tribromofluoroethylene.

12. The plasma etching method according to claim 11, wherein the silicon-containing compound is a compound having at least one of an oxygen atom and a nitrogen atom and a silicon atom or amorphous silicon.

13. The plasma etching method according to claim 11, wherein the etching is performed under a process pressure of 1 Pa or more and 10 Pa or less.

14. The plasma etching method according to claim 10, wherein the silicon-containing compound is a compound having at least one of an oxygen atom and a nitrogen atom and a silicon atom or amorphous silicon.

15. The plasma etching method according to claim 10, wherein the etching is performed under a process pressure of 1 Pa or more and 10 Pa or less.

16. The plasma etching method according to claim 1, wherein the silicon-containing compound is a compound having at least one of an oxygen atom and a nitrogen atom and a silicon atom, or amorphous silicon.

17. The plasma etching method according to claim 16, wherein the etching is performed under a process pressure of 1 Pa or more and 10 Pa or less.

18. The plasma etching method according to claim 1, wherein the etching is performed under a process pressure of 1 Pa or more and 10 Pa or less.

19. The plasma etching method according to claim 1, wherein the etching is performed while applying a bias power of 10 W or more and 1200 W or less to the lower electrode supporting the member to be etched.

20. A method for manufacturing a semiconductor element for manufacturing a semiconductor element using the plasma etching method according to claim 1,
the member to be etched being a semiconductor substrate having the etching object and the non-etching object, the method comprising:
a treatment step of removing at least a part of the etching object from the semiconductor substrate by the etching.

* * * * *